United States Patent
Farrar

(10) Patent No.: US 6,552,432 B2
(45) Date of Patent: Apr. 22, 2003

(54) MASK ON A POLYMER HAVING AN OPENING WIDTH LESS THAN THAT OF THE OPENING IN THE POLYMER

(75) Inventor: Paul A. Farrar, So. Burlington, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/944,984

(22) Filed: Aug. 30, 2001

(65) Prior Publication Data

US 2002/0020920 A1 Feb. 21, 2002

Related U.S. Application Data

(62) Division of application No. 09/145,012, filed on Sep. 1, 1998, now Pat. No. 6,288,442.

(51) Int. Cl.$^7$ .............................. H01L 23/48
(52) U.S. Cl. ............... 257/751; 257/774; 257/775; 257/784; 257/690; 257/643; 257/621
(58) Field of Search ................ 257/621, 643, 257/690, 774, 775, 784, 751

(56) References Cited

U.S. PATENT DOCUMENTS

| | | | |
|---|---|---|---|
| 2,842,438 A | 7/1958 | Saarivirta et al. | 75/153 |
| 3,954,570 A | 11/1976 | Shirk et al. | 204/15 |
| 4,386,116 A | 5/1983 | Nair et al. | 427/99 |
| 4,423,547 A | 1/1984 | Farrar et al. | 29/571 |
| 4,574,095 A | 3/1986 | Baum et al. | 427/53.1 |
| 4,762,728 A | 8/1988 | Keyser et al. | 427/38 |
| 4,788,082 A | 11/1988 | Schmitt | 427/248.1 |
| 4,931,410 A | 6/1990 | Tokunaga et al. | 437/189 |
| 4,948,459 A | * 8/1990 | Van Laarhoven et al. | |
| 4,962,058 A | 10/1990 | Cronin, et al. | 437/187 |
| 4,996,584 A | 2/1991 | Young et al. | 357/71 |
| 5,019,531 A | 5/1991 | Awaya et al. | 437/180 |
| 5,100,499 A | 3/1992 | Douglas | 156/635 |
| 5,130,274 A | 7/1992 | Harper et al. | 437156/195 |
| 5,149,615 A | 9/1992 | Chakravorty et al. | 430/313 |
| 5,158,986 A | 10/1992 | Cha et al. | 521/82 |
| 5,173,442 A | 12/1992 | Carey | 437/173 |
| 5,240,878 A | 8/1993 | Fitzsimmons et al. | 437/187 |
| 5,243,222 A | 9/1993 | Harper et al. | 257/774 |

(List continued on next page.)

OTHER PUBLICATIONS

*In: Kirk–Othmer Concise Encyclopedia of Chemical Technology,* Grayson, M., (ed.), John Wiley & Sons, Inc., New York, NY, p. 433–435, 926–938, (1985).
*In: Metals Handbook,* 8th Edition, vol. 8, ASM Handbook Committee, (eds.), American Society for Metals, Materials Park, OH, p. 300–302.

*Primary Examiner*—Fetsum Abraham
(74) *Attorney, Agent, or Firm*—Schwegman, Lundberg, Woessner & Kluth, P.A.

(57) ABSTRACT

A typical integrated circuit interconnects millions of microscopic transistors and resistors with aluminum wires buried in silicon-dioxide insulation. Yet, aluminum wires and silicon-dioxide insulation are a less attractive combination than gold, silver, or copper wires combined with polymer-based insulation, which promise both lower electrical resistance and capacitance and thus faster, more efficient circuits. Unfortunately, conventional etch-base techniques are ineffective with gold, silver, or copper, and conventional polymer formation promote reactions with metals that undermine the insulative properties of polymer-based insulations. Accordingly, the inventor devised methods which use a liftoff procedure to avoid etching problems and a non-acid-polymeric precursor and non-oxidizing cure procedure to preserve the insulative properties of the polymeric insulator. The resulting interconnective structures facilitate integrated circuits with better speed and efficiency.

6 Claims, 4 Drawing Sheets

U.S. PATENT DOCUMENTS

| | | | | |
|---|---|---|---|---|
| 5,256,205 A | | 10/1993 | Schmitt, III et al. | 118/723 |
| 5,334,356 A | | 8/1994 | Baldwin et al. | 422/133 |
| 5,354,712 A | | 10/1994 | Ho et al. | 437/195 |
| 5,426,330 A | | 6/1995 | Joshi et al. | 257/752 |
| 5,442,237 A | | 8/1995 | Hughes et al. | 257/759 |
| 5,470,789 A | | 11/1995 | Misawa | 437/190 |
| 5,470,801 A | | 11/1995 | Kapoor et al. | 437/238 |
| 5,476,817 A | | 12/1995 | Numata | 437/195 |
| 5,506,449 A | | 4/1996 | Nakano et al. | 257/758 |
| 5,529,956 A | | 6/1996 | Morishita | 437/195 |
| 5,538,922 A | | 7/1996 | Cooper et al. | 437/195 |
| 5,539,060 A | | 7/1996 | Tsunogae et al. | 525/338 |
| 5,625,232 A | | 4/1997 | Numata et al. | 257/758 |
| 5,635,253 A | | 6/1997 | Canaperi et al. | 427/437 |
| 5,662,788 A | | 9/1997 | Sandhu et al. | 205/87 |
| 5,674,787 A | | 10/1997 | Zhao et al. | 437/230 |
| 5,675,187 A | | 10/1997 | Numata et al. | 257/758 |
| 5,679,608 A | | 10/1997 | Cheung et al. | 437/195 |
| 5,681,441 A | | 10/1997 | Svendsen et al. | 205/114 |
| 5,695,810 A | | 12/1997 | Dubin et al. | 427/96 |
| 5,719,089 A | * | 2/1998 | Cherng et al. | |
| 5,739,579 A | | 4/1998 | Chiang et al. | 257/635 |
| 5,780,358 A | | 7/1998 | Zhou | 438/645 |
| 5,785,570 A | | 7/1998 | Bruni | 445/52 |
| 5,792,522 A | | 8/1998 | Jin et al. | 427/575 |
| 5,801,098 A | | 9/1998 | Fiordalice et al. | 438/653 |
| 5,891,797 A | | 4/1999 | Farrar | 438/619 |
| 5,891,804 A | | 4/1999 | Havemann et al. | 438/674 |
| 5,893,752 A | | 4/1999 | Zhang et al. | 438/687 |
| 5,895,740 A | * | 4/1999 | Chien et al. | |
| 5,897,370 A | | 4/1999 | Joshi et al. | 438/632 |
| 5,911,113 A | | 6/1999 | Yao et al. | 438/649 |
| 5,913,147 A | | 6/1999 | Dubin et al. | 438/687 |
| 5,932,928 A | | 8/1999 | Clampitt | 257/758 |
| 5,933,758 A | | 8/1999 | Jain | 438/687 |
| 5,968,333 A | | 10/1999 | Nogami et al. | 205/184 |
| 5,969,422 A | | 10/1999 | Ting et al. | 257/762 |
| 5,972,804 A | | 10/1999 | Tobin et al. | 438/786 |
| 5,976,710 A | | 11/1999 | Sachdev et al. | 428/620 |
| 5,981,350 A | | 11/1999 | Geusic et al. | 438/386 |
| 5,985,759 A | | 11/1999 | Kim et al. | 438/653 |
| 5,994,777 A | | 11/1999 | Farrar | 257/758 |
| 6,008,117 A | | 12/1999 | Hong et al. | 438/629 |
| 6,030,877 A | | 2/2000 | Lee et al. | 438/381 |
| 6,054,172 A | | 4/2000 | Robinson et al. | 427/97 |
| 6,069,068 A | | 5/2000 | Rathore et al. | 438/628 |
| 6,232,219 B1 | * | 5/2001 | Blalock et al. | |

* cited by examiner

MASK ON A POLYMER HAVING AN OPENING WIDTH LESS THAN THAT OF THE OPENING IN THE POLYMER

This is a divisional of Ser. No. 09/145,072 filed Sep. 1, 1998 now U.S. Pat. No. 6,289,442.

FIELD OF INVENTION

The present invention concerns methods of fabricating integrated circuits, particularly methods of forming integrated-circuit wiring, or interconnects, from metals, such as gold, silver, and copper.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together to define a specific electric circuit, such as a computer memory.

Interconnecting millions of microscopic components typically follows one of two different methods, both of which initially entail covering the components with an insulative layer. In the first method, fabricators dig small holes in the insulative layer to expose portions of the components underneath and then, through metallization, the process of depositing a metal, they cover the entire insulative layer with a thin layer, or sheet, of aluminum, filling the holes with aluminum. Fabricators then apply an etch-resistant mask, which defines a wiring pattern, to the aluminum layer and subsequently etch, or dissolve, away unwanted aluminum, leaving behind an aluminum wiring pattern. The second method, known as a damascene process, entails digging trenches between the small holes in the insulative layer and then covering the entire insulative layer with aluminum, filling the holes and trenches with aluminum. Fabricators then polish off the metal outside the holes and trenches, leaving aluminum in the holes and trenches to define the wiring pattern. Both methods typically yield aluminum wires that are about one micron thick, or about 100 times thinner than a human hair.

Silicon dioxide and aluminum are the most common insulative and conductive materials used to form interconnections today. However, at submicron dimensions, that is, dimensions appreciably less than one micron, aluminum and silicon-dioxide interconnection systems present higher electrical resistances and capacitances which waste power and slow down integrated circuits. Moreover, at these smaller dimensions, aluminum exhibits insufficient electromigration resistance, a characteristic which promotes disintegration of the aluminum wires at certain current levels. This ultimately undermines reliability, not only because disintegrating wires eventually break electrical connections but also because aluminum diffuses through surrounding silicon-dioxide insulation, forming short circuits with neighboring wires. Thus, aluminum and silicon-dioxide interconnection systems waste power, slow down integrated circuits, and compromise reliability.

Several metals, such as gold, silver, and copper, appear, because of their lower electrical resistances and higher electromigration resistances, to be promising substitutes for aluminum. And, many polymeric insulators, for example, fluorinated polyimides, because of their lower dielectric constants—an indicator of how much capacitance they will introduce—appear to be promising substitutes for silicon dioxide. Lower capacitance translates into faster, more efficient integrated circuits. Thus, a marriage of these metals with polymers promises to yield low-resistance, low-capacitance interconnective structures that will improve the speed, efficiency, and reliability of integrated circuits.

Unfortunately, conventional etch-based interconnection techniques are impractical for making gold, silver, and copper interconnects. Specifically, silver, gold, and copper, are very difficult to etch. In fact, conventional attempts to etch a layer of silver, gold, or copper covered with an etch-resistant mask usually dissolve the mask faster than the gold, silver, or copper. Additionally, conventional techniques of working with polymers promote chemical reactions between the polymers and metals, such as copper, which undermine the insulative and capacitance-reducing properties of the polymers.

Accordingly, to build smaller, faster, more-efficient, and more-reliable integrated circuits, there is not only a need for new fabrication methods that work with gold, silver, and copper but also a need for methods that effectively combine these metals with the advantages of polymeric insulators.

SUMMARY OF THE INVENTION

To address these and other needs, the inventor has developed methods of making integrated-circuit wiring not only from superior metals such as gold, silver, and copper, but also from superior, capacitance-reducing polymeric insulators, thereby facilitating fabrication of integrated circuits with superior speed, efficiency, and reliability. In one method, the inventor incorporates a liftoff processing technique understood throughout the industry to be unsuitable for submicron applications, to successfully make submicron interconnections from gold, silver, and copper.

Conventional liftoff processing entails masking sections of an insulative layer to define a wiring pattern, and depositing a sheet of aluminum over both the masked and unmasked portions of the insulative layer. The mask and overlying deposits of aluminum are then removed or lifted off, leaving behind aluminum wires on the unmasked surface of the insulative layer. Successful liftoff requires a distinct break or separation between the metal deposited on the mask and metal deposited on the insulative layer. Without this distinct break, lifting the mask pulls and breaks or otherwise damages the microscopic metal structures—the wires—deposited on the insulative layer. Ensuring this distinct break, which conventionally requires building a thick mask having openings with steep, high sidewalls, is thought impractical for micron and submicron metallization because of difficulties in forming thick masks with steep-walled micron and submicron openings. These difficulties stemmed principally from inadequate planarization techniques, photolithographic limitations, and etching-control problems.

To overcome these difficulties in forming narrow, steep-walled openings in masks, the inventor recognized not only that current planarization techniques, such as chemical-mechanical planarization, ameliorated the conventional liftoff requirement of using thick masks to ensure the distinct break, but also that the effective thickness of a thinner mask, which is easier to make, could be increased in two ways. First, the inventor uses the mask to form trenches in the underlying insulative layer, which corresponded to openings in the thin mask, before depositing metal, thereby increasing the effective mask thickness by the depth of the trenches.

And second, the inventor deposits only a thin, seed, or starter, layer of metal over the mask and in the trenches, not only further ensuring the distinct break necessary for successful liftoff, but also reducing the amount of metal for liftoff.

More precisely, one embodiment of the method forms a mask on an insulative layer and forms a hole or trench in the insulative layer through an opening in the mask. The opening is less than one micron wide. Then, the method deposits metal, for example, silver, gold, or copper, through the mask opening into the hole or trench, only partially filling the trench. The mask is then removed or lifted off with little or no risk of destroying the metal wiring in the trenches. To finish filling the trenches, the method concludes with an electroless metal deposition or selective chemical-vapor deposition, with the earlier deposited metal serving as a seed layer for the post-liftoff deposition.

Moreover, in another embodiment, the invention applies this liftoff technique to form silver, gold, and copper conductors in a polymeric insulator formed and cured using a unique procedure that reduces reactions with metals, particularly copper. The new procedure preserves the insulative and capacitance-reducing properties of the polymeric insulator. In contrast, conventional polymer processing techniques promote the formation of conductive oxides which increase the conductivity of the polymer and thus undermines its insulative and capacitance-reducing properties. Thus, the present invention facilitates the fabrication of integrated circuits with superior speed, efficiency, and reliability.

DETAILED DESCRIPTION OF PREFERRED EMBODIMENTS

The following detailed description, which references and incorporates FIGS. 1–10, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
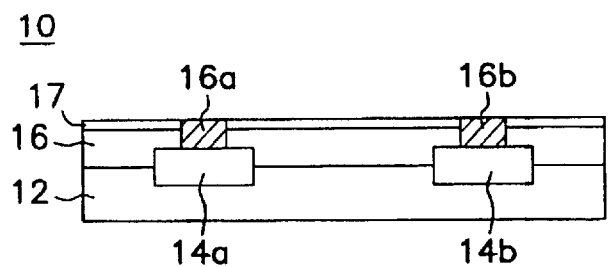
FIG. 1 is a cross-sectional view of an integrated-circuit assembly 10 at an early fabrication stage, including transistors 14a and 14b, an insulative layer 16, contacts 16a and 16b, and a silicon-nitride layer 17.

FIGS. 1–9 show a number of exemplary integrated-circuit assemblies, which taken collectively and sequentially, illustrate an exemplary method of the present invention. The method, as shown in FIG. 1, a cross-sectional view, begins with a known integrated-circuit assembly or structure 10, which can be within any integrated circuit, an integrated memory circuit, for example. Assembly 10 includes a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

Substrate 12 supports a number of integrated elements 14, such as transistors 14a and 14b. Transistors 14a and 14b are covered by a 100-to-500 nanometer-thick, insulative layer 16, which, for example, comprises a silicon oxide. Layer 16 is planarized using chemical-mechanical polishing or other suitable technique. A silicon-nitride layer 17, 50-nanometers thick, covers layer 16. Extending through layers 16 and 17 are two tungsten vias (or contact plugs) 16a and 16b electrically connected to respective transistors 14a and 14b. Although omitted from FIGS. 1–9 for clarity, assembly 10 preferably includes a titanium-silicide diffusion barrier between vias 16a and 16b and transistors 14a and 14b.

Figure 2:
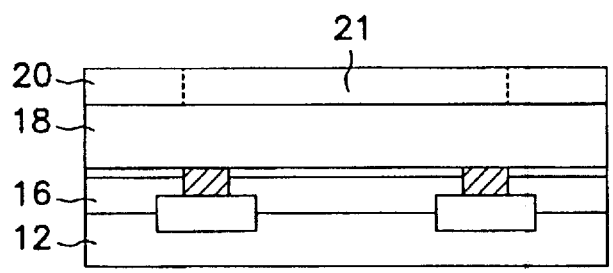
FIG. 2 is a cross-sectional view of the FIG. 1 integrated-circuit assembly after formation of an insulative layer 18 over contacts 16a and 16b and layer 17, a mask 20 having an opening 21 which exposes a portion of layer 18.

FIG. 2 shows that the first step of the exemplary method entails forming an insulative layer 18 atop layer 17. Examples of suitable insulative materials include silicon oxides, such as silicon dioxide, and polymeric materials, such as polyimides. As used herein, the term "polymeric" encompasses organic polymers, organic oligomers, and organic monomers. Collectively, these may be described as materials containing one or more mer units having a carbon-chain backbone. In addition, "polymeric" encompasses materials having properties similar to those of organic polymers. For instance, organic polymers characteristically have high ductility, low elastic modulus, low compressive-yield strength, and/or low thermal-expansion coefficients. Moreover, as used herein, polymeric encompasses polymer precursors, or bases.

The exemplary embodiment forms insulative layer 18 using a non-acid polymeric precursor, that is, a precursor with a pH greater than about 6, and follows a three-stage curing process which makes layer 18 resistant to oxidation reactions with metals such as copper. For more details on this polymer formation, see U.S. patent application Ser. No. 09/128,859 entitled Copper Metallurgy in Integrated Circuits which is incorporated herein by reference. Unlike conventional polymeric processing, this procedure inhibits undesirable increases in the dielectric constant of the resulting polymeric layer and thus yields faster, more efficient interconnect structures. However, the invention encompasses an unlimited number of insulative materials and procedures for making them.

Figure 3:
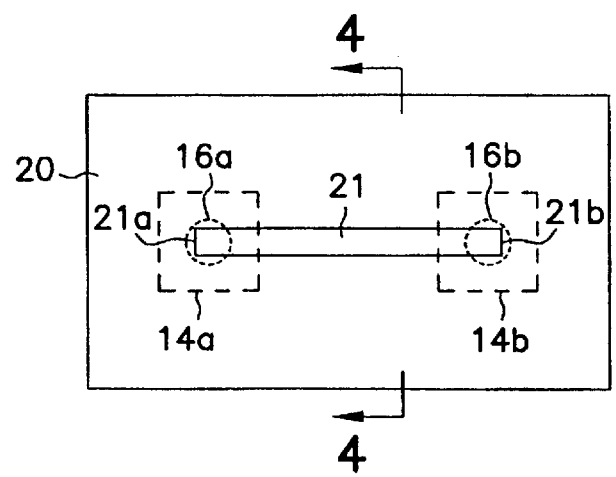
FIG. 3 is a top view of the FIG. 2 integrated-circuit assembly, showing position of opening 21 relative contacts 16a and 16b.

The next step, shown also in FIG. 2 but best illustrated in the FIG. 3 top view, is to form a mask, or stencil, 20 on layer 18, using any suitable masking material and technique, for example, photoresist and conventional photolithography. Although mask 20, in the exemplary embodiment, is a single-layer structure, other embodiments provide a composite mask structure consisting of two or more photoresist layers with a non-resist material, such as silicon nitride, between each pair of photoresist layers.

Figure 4:
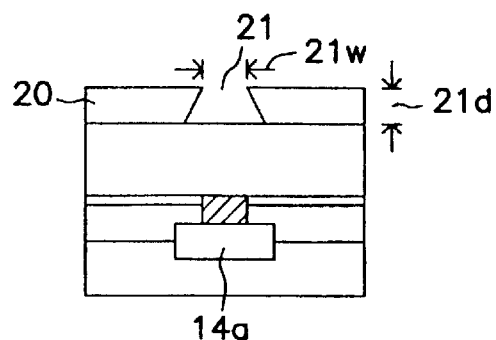
FIG. 4 is a cross-sectional view of the FIG. 3 integrated-circuit assembly, taken along line 4—4 to show depth and width of opening 21.

Mask 20 includes at least one exemplary opening 21, which nominally defines the perimeter of a desired conductor, or metal structure generally. In other embodiments, mask 20 includes hundreds, thousands, or even millions of openings of various shapes and sizes. FIG. 3 shows that opening 21 defines a channel having ends 21a and 21b which overlie respective vias 16a and 16b. FIG. 4, a cross-section of assembly 10 taken along line 4—4 in FIG. 3, shows that opening 21 has a depth 21d of about 500 nanometers and a width 20w of about 250 nanometers, providing an exemplary 2-to-1 aspect ratio. (In contrast conventional liftoff structures range from one to two microns in thickness and have openings with widths of about one micron, because of the conventional wisdom that liftoff is impractical and unreliable for submicron dimensions.) In various embodiments, width 20w is less than about 0.75 microns, less than about 0.5 microns, or less than about 0.25 microns. Opening 21, in the exemplary embodiment, also has negative-sloping sidewalls, although other embodiments provide vertical or even positive sloping sidewalls. The negative-sloping sidewall are formed, for example, using an "image reversal" photographic process. The negative sloping sidewalls facilitate formation of undercut trenches in subsequent steps.

Figure 5:
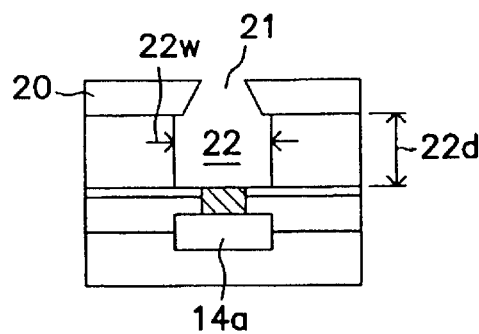
FIG. 5 is a cross-sectional view of the FIG. 4 assembly after using mask 20 to form a trench 22 in layer 18, extending widthwise underneath mask 20.

The next step of the exemplary method, shown in FIG. 5, entails using mask 19 to form a trench 22 in insulative layer 18. Forming trench 22 entails undercutting mask 19 such that trench 22 has a width 22w which, in the exemplary embodiment, is about five percent greater than width 21w of opening 21. As a consequence, mask 20 overhangs the sidewalls of trench 22 and facilitates subsequent liftoff of mask 20 and any overlying metal by ensuring a distinct break or separation between metal deposited on mask 20 and metal deposited in trench 22. To create the overhang, one embodiment forms the trench using an etch process which is not completely anisotropic. Another embodiment uses a hard liftoff mask comprising a silicon-nitride layer between two resist layers and overdevelops the bottom resist layer to create the overhang. However, in other embodiments of the invention, there is no overhang because widths 21w and 22w are substantially equal. In these embodiments, the distinct break results primarily from keeping the thickness of trench deposits less than depth 22d, the depth of trench 22.

The next step, also illustrated in FIG. 5, entails partially filling trench 22 with a conductive metal. More specifically, the exemplary method grows or deposits a 10-nanometer-thick barrier layer 24a and a 50-nanometer-thick metalseed layer 24b on mask 20 and inside trench 22, only partially filling trench 22. Barrier layer 24a prevents diffusion of metal through insulative layer 18. One suitable technique for forming layers 24a and 24b is physical vapor deposition. Examples of suitable barrier materials include zirconium, hafnium, titanium, tantalum, and tantalum nitride. The principle purpose of seed layer 24b, which may also be called a starter layer, is to control placement of material deposited during subsequent selective deposition processes. In the exemplary embodiment, seed layer 24b comprises copper; however, in other embodiments, layer 24b comprises more-conductive metals, such as silver and gold. In general, the method is not limited to any particular metals, or type of metals. Indeed, the method can be practiced with non-metallic materials.

Figure 7:
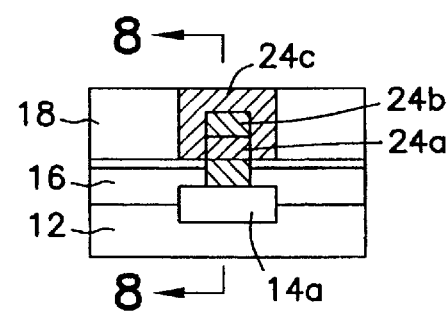
FIG. 7 is a cross-sectional view of the FIG. 6 assembly after removing, or lifting off, mask 20 and overlying portions of layers 24a and 24b and after forming conductive layer 24c atop layer 24b in trench 20.

Next, as FIG. 7 shows, the method entails removing or lifting off mask 20 and overlying portions of layers 24a and 24b, leaving behind the portions of layers 24a and 24b occupying trench 22. One suitable method of lifting off mask 20 and the overlying portions of layers 24a and 24b is to use a two-stage tape-assisted liftoff, a technique which entails lifting off the overlying metal using a first adhesive strip or patch of material and then using a chemical-resist-removal process to remove any remaining mask material. Another suitable technique entails dissolving the mask, for example, in a liquid etchant. The invention encompasses all techniques for removing the mask and overlying metal without completely destroying the portions of layers 24a and 24b in trench 22.

After removal of mask 20 and excess portions of layers 24a and 24b, the method entails continued filling of trench 22 with a conductive metal, such as gold, silver, or copper, to form a conductive metal layer 24c atop layer 24b. The exemplary method fills the trench substantially flush with the top surface of insulative layer 18, using a selective electroless plating or selective chemical-vapor deposition. (As used herein, electroless plating, or deposition, at least encompasses any autocatalytic deposition of a film through the interaction of a metal salt and a chemical reducing agent.) For an example of an electroless deposition of copper, see U.S. Pat. No. 4,574,095, which is entitled Electroless Copper Deposition on Metals and Silicides and incorporated herein by reference.

Figure 8:
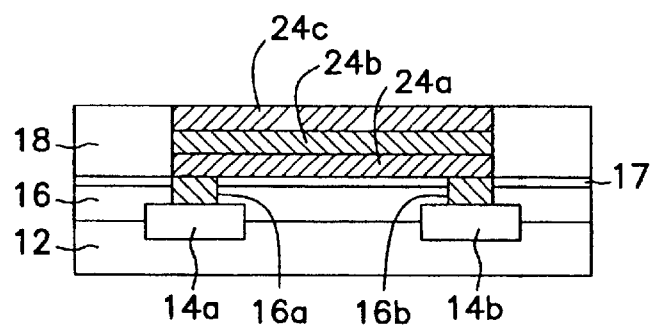
FIG. 8 is a cross-sectional view of the FIG. 7 assembly showing that conductor 24, which includes layers 24a, 24b, and 24c, connects not only contacts 16a and 16b but also transistors 14a and 14b.

FIG. 8, a cross-sectional view taken along line 8—8 in FIG. 7, shows the resulting three-layer metal conductor 24, which electrically connects vias 16a and 16b and therefore connects transistors 14a and 14b. In the exemplary embodiment, conductor 24 has a width 24w of about 0.15 microns, which is about 700 percent less than the width of conductors normally formed using conventional liftoff procedures. However, in other embodiments, width 24w is less than about 0.75 microns, less than about 0.5 microns, or less than about 0.25 microns. Formation of conductor 24 completes the first level of metallization.

Figure 9:
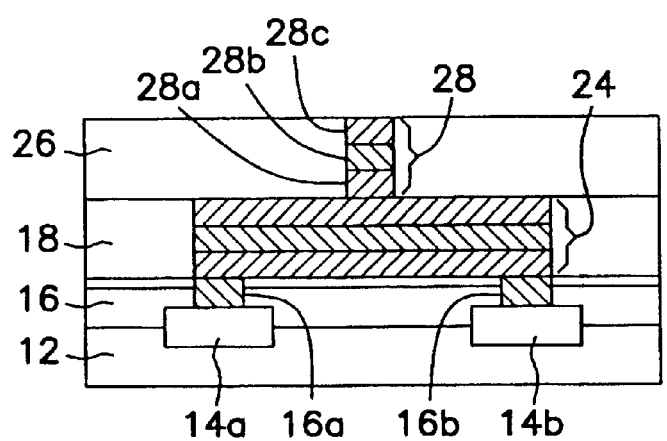
FIG. 9 is a cross-sectional view of the FIG. 8 assembly after formation of a second metallization level incuting insulative layer 26 and conductor 28.

FIG. 9 shows a completed second-level metallization, specifically a second insulative layer 28 and a second three-layer metal conductor 28. In the exemplary embodiment, conductor 28 is a via, contact, or vertical stud electrically connected to conductor 24 and thus also to transistors 14a and 14b. In other embodiments of the invention, conductor 28 is a conductive line which crosses, or intersects, conductor 24.

Formation of both layer 28 and conductor 28 generally follows the exemplary procedure used for insulative layer 18 and conductor 24. In brief, this entails forming layer 28 of an insulative material similar to layer 18; forming a mask having one or more openings that define, for example, studs, contacts, or vias. Afterward, the method etches a corresponding opening in layer 28, which extends underneath the mask to create overhangs similar to those shown for mask 20 and trench 22 in FIG. 5. With the mask in place, the next steps form a 10-nanometer-thick barrier layer 28a and a 50-nanometer-thick adhesion layer 28b, both on the mask and on insulative layer 26. Then after removing the mask, electroless deposition or chemical vapor deposition is used to form the third layer 28c of conductor 28. Subsequent metallizations would follow similarly.

Although the embodiments described above follow a single damascene process, other embodiments follow a dual-damascene process. The dual-damascene process generally entails separate maskings to form the vias and trenches in an insulative layer. After formation of the via and trenches, the method proceeds with deposition of the barrier and seed materials (using the trench mask as a stencil) into the trenches, liftoff of the trench mask, and selective deposition of a metal onto the seed material.

EXEMPLARY EMBODIMENT OF AN INTEGRATED MEMORY CIRCUIT

Figure 10:
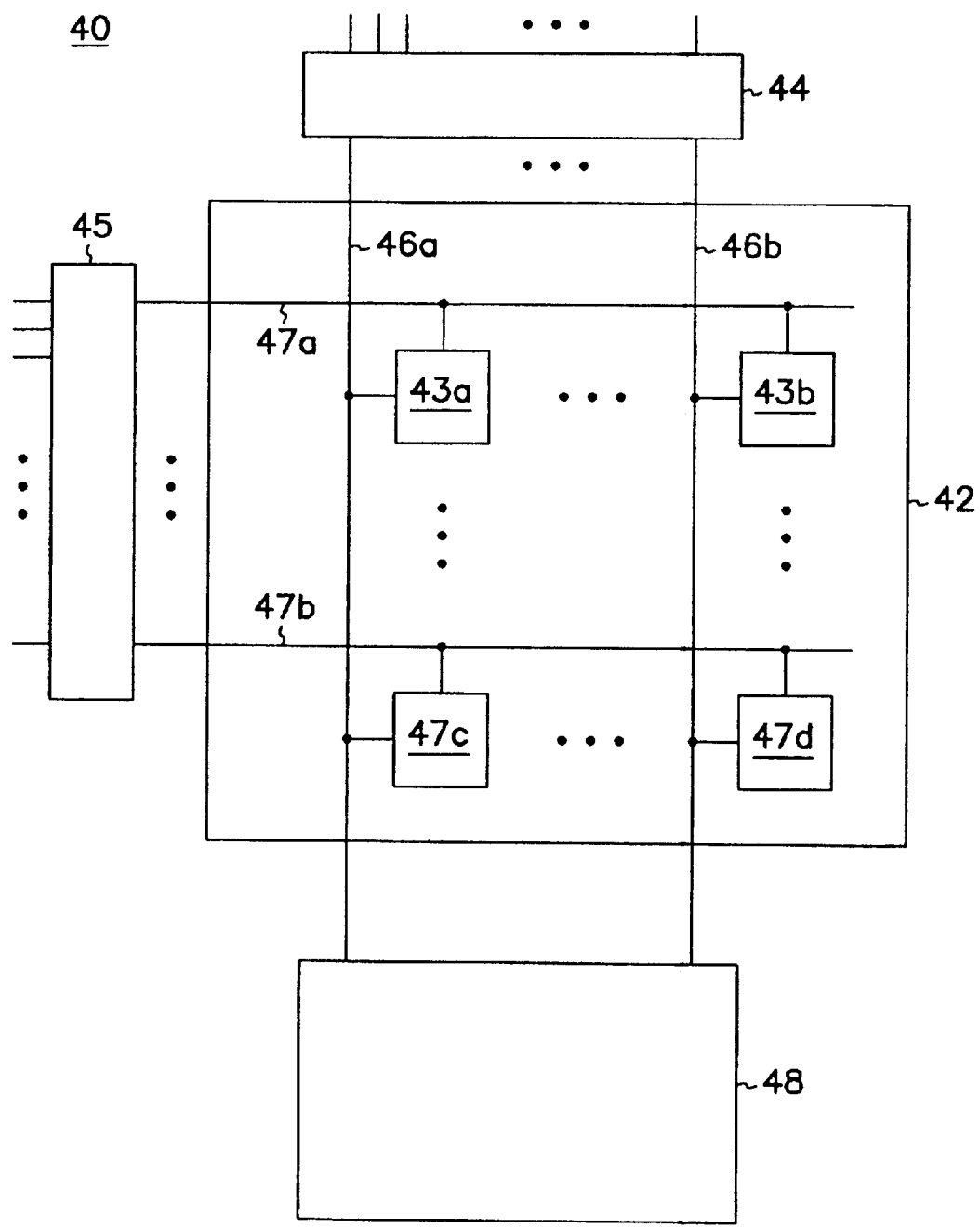
FIG. 10 is a block diagram of a generic integrated memory circuit incorporating one or more interconnect structures of the present invention.

FIG. 10 shows one example of the unlimited number of integrated circuits which would benefit from incorporation of the faster, more-efficient, and more reliable interconnect structures of the present invention: a generic integrated memory circuit 40. Memory circuit 40, which operates according to well-known and understood principles, is generally coupled to a processor (not shown) to form a computer system. More particularly, circuit 40 includes a memory array 42 which comprises a number of memory cells 43, a column address decoder 44, and a row address decoder 45, bit lines 46, word lines 47, and voltage-sense-amplifier circuit 48 coupled in conventional fashion to bit lines 46.

In the exemplary embodiment, the memory cells, the address decoders, and amplifier circuit are interconnected via at least one gold, silver, or copper conductor formed according to a method embodying the present invention. In other embodiments, only certain components, for example memory array 42 and voltage-sense-amplifier circuit 48, are interconnected via such conductors. Moreover, some embodiments embed these conductors in non-acid-based polymeric insulators, which ultimately reduce capacitance and thus enhance efficiency and speed of the integrated circuit.

CONCLUSION

In furtherance of the art, the inventor has developed methods of making integrated-circuit wiring systems not only from superior metals such as gold, silver, and copper, but also from superior, capacitance-reducing polymeric insulators. To overcome the inability of conventional etch-based techniques to work with gold, silver and copper, the inventor devised a liftoff procedure, which in one embodiment entails forming a hole or trench through an opening in a mask structure, at least partially filling the hole or trench with gold, silver, or copper, lifting off the mask structure, and then finishing filling the trench with metal using an electroless deposition. And, to overcome problems with polymers reacting with certain metals, such as copper, the inventor devised a unique polymer-formation procedure involving a non-acid-polymeric precursor and non-oxidizing cure technique. In sum, various embodiments of the invention ultimately facilitate fabrication of integrated circuits, such as integrated memory circuits, with superior speed, efficiency, and reliability.

The embodiments described above are intended only to illustrate and teach one or more ways of practicing or implementing the present invention, not to restrict its breadth or scope. The actual scope of the invention, which encompasses all ways of practicing or implementing the concepts of the invention, is defined only by the following claims and their equivalents.

What is claimed is:

1. An integrated-circuit assembly comprising:
   one or more transistor contact regions;
   an oxidation-resistant polymeric layer having one or more openings, with each opening exposing at least a portion of one of the transistor contact regions and having a respective width; and
   a mask layer overlying the oxidation resistant polymeric layer having a mask opening overlying at least one of the openings in the polymeric layer, with the mask opening having a width less than the width of the one opening in the polymeric layer.

2. The integrated-circuit assembly of claim 1, wherein each of the one or more transistor contact regions comprises a contact.

3. The integrated-circuit assembly of claim 1, wherein the mask opening has one or more negative sloping sidewalls.

4. The integrated-circuit assembly of claim 1, wherein the width of the one opening in the polymeric layer is at least five percent greater than the width of the mask opening.

5. An integrated-circuit assembly comprising:
   one or more transistor contact regions;
   an oxidation-resistant polymeric layer having one or more openings, with each opening exposing at least a portion of one of the transistor contact regions and having a respective width;
   a mask layer overlying the oxidation-resistant polymeric layer having a mask opening overlying at least one of the openings in the polymeric layer, with the mask opening having a width less than the width of the one opening in the polymeric layer;
   a diffusion-barrier layer having at least a first diffusion-barrier portion on the mask layer and at least a second diffusion-barrier portion within the opening in the polymeric layer on at least one or more of the transistor contact regions; and
   a copper-, gold-, or silver-based layer having at least a portion on the first diffusion-barrier portion and at least a portion on the second diffusion-barrier portion.

6. The integrated-circuit assembly of claim 5, wherein the mask opening has a width less than about 0.25 microns.

* * * * *

UNITED STATES PATENT AND TRADEMARK OFFICE
CERTIFICATE OF CORRECTION

PATENT NO. : 6,552,432 B2
APPLICATION NO. : 09/944984
DATED : April 22, 2003
INVENTOR(S) : Paul A. Farrar It is certified that error appears in the above-identified patent and that said Letters Patent is hereby corrected as shown below:

On Title page, in item (54), in the title, insert --A-- before "MASK".

On the Title page, in item (56), under "U.S. PATENT DOCUMENTS", column 1, line 2, delete "11/1976" and insert --6/1976-- therefor.

On the Title page, in item (56), under "U.S. PATENT DOCUMENTS", column 1, line 9, insert --156-- after "Van Laarhoven et al.".

On page two, under "U.S. PATENT DOCUMENTS", column 1, line 21, insert --438-- after "Cherng et al.".

On page two, under "U.S. PATENT DOCUMENTS", column 2, line 6, insert --430-- after "Chien et al.".

On page two, under "U.S. PATENT DOCUMENTS", column 2, line 23, insert --438-- after "Blalock et al.".

On the Title page, in item (56), under "OTHER PUBLICATIONS", insert the following: --

*In: Metals Handbook*, Ninth Edition, vol. 2, Properties and Selection: Nonferrous Alloys and Pure Metals, ASM Handbook Committee, (eds.), American Society for Metals, Metals Park, OH, (1989), pp. 157, 395

*In: Kirk-Othmer Concise Encyclopedia of Chemical Technology*, Grayson, M., (ed.), John Wiley & Sons, Inc., New York, NY, (1985), pp. 433-435, 926-938

*In: Metals Handbook*, 8th Edition, vol. 8, ASM Handbook Committee, (eds.), American Society for Metals, Materials Park, OH, pp. 300-302

"Brooks Model 5964 High Performance Metal Seal Mass Flow Controller (Introduced in 1991)", *Brooks Instrument*, http://www.frco.com/brooks/semiconductor/productsli.html,(1991), 1 page Abe, K., et al., "Sub-half Micron Copper Interconnects Using Reflow of Sputtered Copper Films", *VLSI Multilevel Interconnection Conference*, (June 25-27, 1995), pp. 308-311

Andricacos, P.C., "Copper On-Chip Interconnections", *The Electrochemical Society Interface*, (1999), pp. 32-37

UNITED STATES PATENT AND TRADEMARK OFFICE
CERTIFICATE OF CORRECTION

PATENT NO. : 6,552,432 B2
APPLICATION NO. : 09/944984
DATED : April 22, 2003
INVENTOR(S) : Paul A. Farrar It is certified that error appears in the above-identified patent and that said Letters Patent is hereby corrected as shown below:

"Formation of Conductors at Variable Depths--Using Differential Photomask, Projecting Images into Insulator by Reactive Ion Etching, Selectively Filling Images with Conductor", *Research Disclosure*, Disclosure No. RD 291015, Abstract, (July 10, 1988), 1 page.

"Improved Metallurgy for Wiring Very Large Scale Integrated Circuits", *International Technology Disclosures*, 4, Abstract, (1986), 1 page Bae, S., et al., "Low-Temperature Deposition Pathways to Silicon Nitride, Amorphous Silicon, Polycrystalline Silicon, and n type Amorphous Silicon Films Using a High Density Plasma System", *IEEE Conference Records*--Abstracts, International Conference on Plasma Science, (1997), p. 315

Bai, G., et al., "Copper Interconnection Deposition Techniques and Integration", 1996 Symposium on VLSI Technology, *Digest of Technical Papers*, (1996), pp. 48-49

Bernier, M., et al., "Laser processing of palladium for selective electroless copper plating", *SPIE*, 2045, (1994), pp. 330-337

Bhansali, S., et al., "A novel technique for fabrication of metallic structures on polymide by selective electroless copper plating using ion implantation", *Thin Solid Films*, 270, No. 1/02, (1995), pp. 489-492

Bhansali, S., et al., "Selective electroless copper plating on silicon seeded by copper ion implantation", *Thin Solid Films*, 253, (1994), pp. 391-394

Braud, F., "Ultra Thin Diffusion Barriers for Cu Interconnections at The Gigabit Generation and Beyond", *VMIC Conference Proceedings*, (1996), pp. 174-179

Cabrera, A.L., et al., "Oxidation protection for a variety of transition metals and copper via surface silicides formed with silane containing atmospheres", *J. Mater. Res.*, 6(1), (1991), pp. 71-79

Chakravorty, K. K., et al., "High-Density Interconnection Using Photosensitive Polyimide and Electroplated Copper Conductor Lines", *IEEE Transactions on Components, Hybrids, and Manufacturing Technology*, 13(1), (March 1990), p. 200-206

Craig, J.D., "Polymide Coatings", In: Packaging, Electronic Materials Handbook, vol. 1, ASM International Handbook Committee (eds.), *ASM International, Materials Park,*

UNITED STATES PATENT AND TRADEMARK OFFICE
CERTIFICATE OF CORRECTION

PATENT NO.         : 6,552,432 B2
APPLICATION NO. : 09/944984
DATED                  : April 22, 2003
INVENTOR(S)       : Paul A. Farrar It is certified that error appears in the above-identified patent and that said Letters Patent is hereby corrected as shown below:

OH, (1989), pp. 767-772
De Felipe, T.S., et al, "Electrical Stability and Microstructural Evolution in Thin Films of High Conductivity Copper Alloys", *IEEE*, (1999), pp. 293-295

Ding, "Copper Barrier, Seed Layer and Planerization Technologies", *VMIC Conference Proceedings*, (1997), pp. 87-92

Dubin, V.M. , et al., "Selective and Blanket Electroless Copper Deposition for Ultralarge Scale Integration", *J. Electrochem. Soc.*, 144(3), (1997), pp. 898-908

Dushman, S., et al., *Scientific Foundations of Vacuum Technique*, 2nd Edition, John Wiley and Sons, (1962), pp. 1-806

Edelstein, D., "Full Copper Wiring in a Sub-0.25 micrometer CMOS ULSI Technology", *IEDM*, (1997), pp. 773-776

Eldridge, J.M., "New Approaches for Investigating Corrosion in Thin Film Devices", *Electronic Packaging and Corrosion in Microelectronics, Proceedings of ASM's Third Conference on Electric Packaging: Materials and Processes & Corrosion in Microelectronics,* Mpls, MN, (1987), pp. 283-285

Ernst, et al., "Growth Model for Metal Films on Oxide Surface: Cu on ZnO(0001)-O"", *Physical Review B*, 47, (May 15, 1993), pp. 13782-13796

Gladlfelter, W.L., et al., "Trimethylamine Complexes of Alane as Precursors for the Low- Pressure Chemical Vapor Deposition of Aluminum", *Chemistry of Materials*, 1, (1989), pp. 339-343

Godbey, D.J., et al., "Copper Diffusion in Organic Polymer Resists and Inter-level Dielectrics", *Thin Solid Films*, 308-309, (1997), pp. 470-474

Grimblot, J., et al., "II. Oxidation of Aluminum Films", *J. Electrochem.*, 129, (1982), pp. 2369-2372

Hattangady, S.V., et al., "Integrated processing of silicon oxynitride films by combined plasma and rapid-thermal processing", *J. Vac. Sci. Technol. A*, 14(6), (1996), pp. 3017-3023

Hirao, S., et al., "A Novel Copper Reflow Process Using Dual Wetting Layers", 1997 *Symposium on VLSI Technology*, Digest of Technical Papers, (1997), pp. 57-58

UNITED STATES PATENT AND TRADEMARK OFFICE
CERTIFICATE OF CORRECTION

PATENT NO. : 6,552,432 B2
APPLICATION NO. : 09/944984
DATED : April 22, 2003
INVENTOR(S) : Paul A. Farrar It is certified that error appears in the above-identified patent and that said Letters Patent is hereby corrected as shown below:

Hirata, A., et al., "WSiN Diffusion Barrier Formed by ECR Plasma Nitridation for Copper Damascene Interconnection", *16th Solid State Devices and Materials*, (1998), pp. 260-261

Holloway, K., et al., "Tantalum as a diffusion barrier between copper and silicon", *Appl. Phys. Lett.*, 57(17), (October 1990), pp. 1736-1738

Hu, C.K., et al., "Extendibility of Cu Damascene to 0.1 micrometer Wide Interconnections", *Mat. Res. Soc. Symp. Proc*, 514, (1998), pp. 287-292

Hymes, S., et al., "Passivation of Copper by Silicide Formation in Dilute Silane", *Conference Proceedings ULSI- VII*, (1992), pp. 425-431

Iijima, T., "Microstructure and Electrical Properties of Amorphous W-Si-N Barrier Layer for Cu Interconnections", *1996 VMIC Conference*, (1996), pp. 168-173

Izaki, M., et al., "Characterization of Transparent Zinc Oxide Films Prepared by Electrochemical Reaction", *Journal of the Electrochemical Society*, 144, (June 1997), pp. 1949-1952

Jayaraj, K., et al., "Low Dielectric Constant Microcellular Foams" *Proceedings from the Seventh Meeting of the DuPont Symposium on Polymides in Microelectrics*, (September 1996), pp. 474-501

Jeon, Y., et al., "Low-Temperature Fabrication of Polycrystalline Silicon Thin Films by ECR Pecvd", *The Electrochemical Society Proceedings*, 94(35), (1995), pp. 103-114

Jin, C., et al., "Porous Xerogel Films as Ultra-low Permittivity Dielectrics for ULSI Interconnect Applications", *Conference Proceedings ULSI XII -1997 Materials Research Society*, (1997), pp. 463-469

Kamins, T.I., "Structure and Properties of LPCVD Silicon Films", *J. Electrochem. Soc.: Solid-State Science and Technology*, 127, (March 1980), pp. 686-690

Kang, H.K., et al., "Grain Structure and Electromigration Properties of CVD CU Metallization", *Proceedings of the 10th International VLSI Multilevel Interconnection Conference*, (June 8-9, 1993), pp. 223-229

Keppner, H., et al., "The "Micromorph" Cell: A New Way to High-Efficiency-Low-Temperature Crystalline Silicon Thin-Film Cell Manufacturing", *Mat. Res. Soc. Symp.*

UNITED STATES PATENT AND TRADEMARK OFFICE
CERTIFICATE OF CORRECTION

PATENT NO. : 6,552,432 B2
APPLICATION NO. : 09/944984
DATED : April 22, 2003
INVENTOR(S) : Paul A. Farrar It is certified that error appears in the above-identified patent and that said Letters Patent is hereby corrected as shown below:

*Proc.*, 452, (1997), pp. 865-876
Kiang, M., et al., "Pd/Si plasma immersion ion implantation for selective electroless copper plating on Si02", *Appl. Phys. Lett.*, 60, (1992), pp. 2767-2769

Kistiakowsky, G.B., et al., "Reactions of Nitrogen Atoms. I. Oxygen and Oxides of Nitrogen", *The Journal of Chemical Physics*, 27(5), (1957), pp. 1141-1149

Laursen, T., "Encapsulation of Copper by Nitridation of Cu-Ti Alloy/Bilayer Structures", *International Conference on Metallurgical Coatings and Thin Films*, Abstract No. H1.03, San Diego, CA, (April 1997), p. 309

Len, V., et al., "An investigation into the performance of diffusion barrier materials against copper diffusion using metal-oxide-semiconductor (MOS) capacitor structures", *Solid-State Electronics*, 43, (1999), pp. 1045-1049

Lyman, T., et al., "Metallography, Structures and Phase Diagrams", *Metals Handbook*, 8, American Society for Metals, Metals Park, Ohio, (1989), pp. 300, 302

Marcadal, C., "OMCVD Copper Process for Dual Damascene Metallization", *VMIC Conference*, ISMIC, (1997), pp. 93-97

Miller, R.D., et al., "Low Dielectric Constant Polyimides and Polyimide Nanofoams", *Seventh Meeting of the DuPont Symposium on Polymides in Microelectronics*, (September 1996), pp. 443-473

Miyake, T., et al., "Atomic Hydrogen Enhanced Reflow of Copper", *Applied Physics Letters*, 70, (1997), pp. 1239-1241

Murarka, S.P., et al., "Copper Interconnection Schemes: Elimination of The Need of Diffusion Barrier/Adhesion Promoter by the Use of Corrosion Resistant, Low Resistivity Doped Copper", *SPIE*, 2335, (1994), pp. 80-90

Nakao, S., et al., "Thin and Low-Resistivity Tantalum Nitride Diffusion Barrier and Giant-Grain Copper interconnects for Advanced ULSI Metallization", *Japanese Journal of Applied Physics*, 38(4B), (April 1999), pp. 262-263

Newboe, B., et al., "Applied Materials Announces First Barrier/Seed Layer System For Copper Interconnects", *Applied Materials*, http://www.appliedmaterials.com/newsroom/pr-00103.html,(1997), pp. 1-4

UNITED STATES PATENT AND TRADEMARK OFFICE
CERTIFICATE OF CORRECTION

PATENT NO.       : 6,552,432 B2
APPLICATION NO.  : 09/944984
DATED            : April 22, 2003
INVENTOR(S)      : Paul A. Farrar It is certified that error appears in the above-identified patent and that said Letters Patent is hereby corrected as shown below:

Okamoto, Y., et al., "Magnetically Excited Plasma Oxynitridation of Si at Room Temperature", *Jpn. J. Appl. Phys.*, 34, (1995), pp. L955-957

Palleau, J., et al., "Refractory Metal Encapsulation in Copper Wiring", *Advanced Metallization for Devices and Circuits-Science, Technology and Manufacturability, Materials Research Society Symposium Proceedings*, 337, (April 1994), pp. 225-231

Park, C.W., et al., "Activation Energy for Electromigration in Cu Films", *Applied Physics Letters*, 59, (July 6, 1991), pp. 175-177

Radzimski, Z.J., et al., "Directional Copper Deposition using d-c Magnetron Selfsputtering", *J. Vac. Sci. Technol. B*, 16(3), (1998), pp. 1102-1106

Ramos, T., et al., "Nanoporous Silica for Dielectric Constant Less Than 2", *Conference Proceedings ULSI XII -1997 Materials Research Society*, (1997), pp. 455-461

Rath, J.K., et al., "Low-Temperature deposition of polycrystalline silicon thin films by hot-wire CVD", *Solar Energy Materials and Solar Cells*, 48, (1997), pp. 269-277

Ray, S.K., et al., "Flourine-enhanced nitridation of silicon at low temperatures in a microwave plasma", *J. Appl. Phys.*, 70(3), (1991), pp. 1874-1876

Rossnagel, S.M., "Magnetron Sputter Deposition of Interconnect Applications", *Conference Proceedings, ULSI XI*, (1996), pp. 227-232

Rossnagel, S.M., et al., "Metal ion deposition from ionized mangetron sputtering discharge", *J. Vac. Sci. Technol. B*, 12(1), (1994), pp. 449-453

Ryan, J.G., "Copper Interconnects for Advanced Logic and DRAM", *Extended Abstracts of the 1998 International Conference on Solid-State Devices and Materials*, Hiroshima, (1998), pp. 258-259

Ryu, C., et al., "Barriers for copper interconnections", *Solid State Technology*, (April 1999), pp. 53,54,56

Saarivirta, M.J., "High Conductivity Copper Rich Cu-Zr Alloys", *Transactions of the Metallurgical Society of AIME*, 218, (1960), pp. 431-437

UNITED STATES PATENT AND TRADEMARK OFFICE
CERTIFICATE OF CORRECTION

PATENT NO.       : 6,552,432 B2
APPLICATION NO.  : 09/944984
DATED            : April 22, 2003
INVENTOR(S)      : Paul A. Farrar It is certified that error appears in the above-identified patent and that said Letters Patent is hereby corrected as shown below:

Senzaki, Y., "Chemical Vapor Deposition of Copper using a New Liquid Precursor with Improved Thermal Stability", *Conference Proceedings ULSI XIII, Materials Research Society*, (1998), pp. 451-455

Shacham-Diamand, Y., "100 km Wide Copper Lines Made by Selective Electroless Deposition", *Journal of Micromechanics and Microengineering*, 1, (March 1991), pp. 66-72

Shacham-Diamand, Y., et al., "Copper electroless deposition technology for ultra-large-scale-integration (ULSI) metallization", *Microelectronic Engineering*, 33, (1997), pp. 47-58

Srivatsa, A.R., et al., "Jet Vapor Deposition: an Alternative to Electrodeposition", *Surface Engineering*, 11, (1995), pp. 75-77

Tao, J., et al., "Electromigration Characteristics of Copper Interconnects", *IEEE Electron Devices Letters*, 14, (May 1993), pp. 249-251

Ting, C.H., "Methods and Needs for Low K Material Research", *Materials Research Society Symposium Proceedings*, volume 381, Low-Dielectric Constant Materials--Synthesis and Applications in Microelectronics, Lu, T.M., et al, (eds.), San Francisco, CA, (April 17-19, 1995), pp. 3-17

Tsukada, T., et al., "Adhesion of copper films on ABS polymers deposited in an internal magnet magnetron sputtering system", *J. Vac. Sci. Technol.*, 16(2), (1979), pp. 348-351

Van Vlack, L.H., "Elements of Materials Science", *Addison-Wesley Publishing Co., Inc.* Reading, MA, (1959), p. 468

Venkatesan, S., et al., "A High Performance 1.8V, 0.20 micrometer CMOS Technology with Copper Metalization", *IEEE*, (1997), pp. 769-772

Vossen, J.L., et al., Thin Film Processes II, *Academic Press, Inc.*, (1991), pp. 1-866

Wang, X.W., et al., "Highly Reliable Silicon Nitride Thin Films Made by Jet Vapor Deposition", *Japanese Journal of Applied Physics*, 34, (February 1995), pp. 955-958

Wang, K., et al., "Very Low Temperature Deposition of Polycrystalline Silicon Films with Micro-Meter-Order Grains on $SiO_2$", *Mat. Res. Soc. Symp. Proc.*, 355, (1995), pp.

UNITED STATES PATENT AND TRADEMARK OFFICE
CERTIFICATE OF CORRECTION

PATENT NO. : 6,552,432 B2
APPLICATION NO. : 09/944984
DATED : April 22, 2003
INVENTOR(S) : Paul A. Farrar It is certified that error appears in the above-identified patent and that said Letters Patent is hereby corrected as shown below:

581-586
Winters, H.F., et al., "Influence of Surface Absorption Characteristics on Reactivity Sputtered Films Grown in the Biased and Unbiased Modes", *J. Appl. Phys.*, 43(3), (1972), pp. 794-799

Wolf, S., et al., Silicon Processing for the VLSI Era, Vol. 1 --*Process Technology, Lattice Press*, Sunset Beach, CA, (1986), pp. 514-538

Yeh, J.L., et al., "Selective Copper plating of Polysilicon Surface Micromachined Structures", *Solid-State Sensor and Actuator Workshop*, (1998), pp. 248-251

Zhang, J., et al., "Investigations of photo-induced decomposition of palladium acetate for electroless copper plating", *Thin Solid Films*, 318, (1998), pp. 234-238 --

Column 1, line 1, in the title, insert --A-- before "MASK".

Column 3, line 63, delete "incuting" and insert --including-- therefor.

Figure 6:
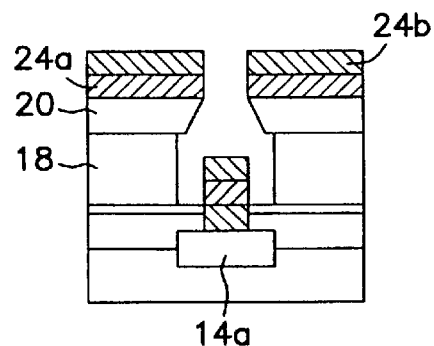
FIG. 6 is a cross-sectional view of the FIG. 5 assembly after using mask 20 to form a barrier layer 24a and a metal-seed layer 24b both of which overlie mask 20 and at least partially fill trench 22.

Column 5, line 51, delete "FIG. 5" and insert --FIG. 6-- therefor.

Column 8, line 51, below claim 6, insert the following:

--7. The integrated-circuit assembly of claim 1, wherein the mask layer contacts the polymeric layer.

8. The integrated-circuit assembly of claim 1, wherein the mask layer consists of photoresist.

9. The integrated-circuit assembly of claim 1, wherein the mask layer comprises a resist material and a non-resist material.

10. The integrated-circuit assembly of claim 1, wherein the mask layer comprises a lift-off structure.

11. The integrated-circuit assembly of claim 5, wherein the mask layer contacts the polymeric layer.

UNITED STATES PATENT AND TRADEMARK OFFICE
CERTIFICATE OF CORRECTION

| | |
|---|---|
| PATENT NO. | : 6,552,432 B2 |
| APPLICATION NO. | : 09/944984 |
| DATED | : April 22, 2003 |
| INVENTOR(S) | : Paul A. Farrar |

It is certified that error appears in the above-identified patent and that said Letters Patent is hereby corrected as shown below:

12. An integrated-circuit assembly comprising:
one or more transistor contact regions;
an oxidation-resistant polymeric layer having one or more openings, with each opening exposing at least a portion of one of the transistor contact regions and having a respective width;
a mask layer overlying the oxidation-resistant polymeric layer having a mask opening overlying at least one of the openings in the polymeric layer, with the mask opening having a width less than the width of the one opening in the polymeric layer;
a diffusion-barrier layer having at least a first diffusion-barrier portion on the mask layer and at least a second diffusion-barrier portion within the opening in the polymeric layer and at least a second diffusion-barrier portion within the opening in the polymeric layer on at least one or more of the transistor contact regions; and
a copper-based layer having at least a portion on the first diffusion-barrier portion and at least a portion on the second diffusion-barrier portion.

13. The integrated-circuit assembly of claim 12, wherein the mask opening has a width less than about 0.25 microns.

14. The integrated-circuit assembly of claim 12, wherein the mask layer contacts the polymeric layer.

15. The integrated-circuit assembly of claim 12, wherein the diffusion-barrier layer consists of zirconium, hafnium, titanium, tantalum, or tantalum nitride.

16. An integrated-circuit assembly comprising:
one or more transistor contact regions;
an oxidation-resistant polymeric layer having one or more openings, with each opening exposing at least a portion of one of the transistor contact regions and having a respective width;
a mask layer overlying the oxidation-resistant polymeric layer having a mask opening overlying at least one of the openings in the polymeric layer, with the mask opening having a width less than the width of the one opening in the polymeric layer;
a diffusion-barrier layer having at least a first diffusion-barrier portion on the mask layer and at least a second diffusion-barrier portion within the opening in the polymeric layer on at least one or more of the transistor contact regions; and
a gold-based layer having at least a portion on the first diffusion-barrier portion and at least a portion on the second diffusion-barrier portion.

UNITED STATES PATENT AND TRADEMARK OFFICE
CERTIFICATE OF CORRECTION

| | | |
|---|---|---|
| PATENT NO. | : 6,552,432 B2 | |
| APPLICATION NO. | : 09/944984 | |
| DATED | : April 22, 2003 | |
| INVENTOR(S) | : Paul A. Farrar | |

It is certified that error appears in the above-identified patent and that said Letters Patent is hereby corrected as shown below:

17. The integrated-circuit assembly of claim 16, wherein the mask opening has a width less than about 0.25 microns.

18. The integrated-circuit assembly of claim 16, wherein the diffusion-barrier layer consists of zirconium, hafnium, titanium, tantalum, or tantalum nitride.

19. The integrated-circuit assembly of claim 16, wherein the mask layer contacts the polymeric layer.

20. An integrated-circuit assembly comprising:
one or more transistor contact regions;
an oxidation-resistant polymeric layer having one or more openings, with each opening exposing at least a portion of one of the transistor contact regions and having a respective width;
a mask layer overlying the oxidation-resistant polymeric layer having a mask opening overlying at least one of the openings in the polymeric layer, with the mask opening having a width less than the width of the one opening in the polymeric layer;
a diffusion-barrier layer having at least a first diffusion-barrier portion on the mask layer and at least a second diffusion-barrier portion within the opening in the polymeric layer on at least one or more of the transistor contact regions; and
a silver-based layer having at least a portion on the first diffusion-barrier portion and at least a portion on the second diffusion-barrier portion.

21. The integrated-circuit assembly of claim 20, wherein the mask opening has a width less than about 0.25 microns.

22. The integrated-circuit assembly of claim 20, wherein the diffusion-barrier layer consists of zirconium, hafnium, titanium, tantalum, or tantalum nitride.

23. The integrated-circuit assembly of claim 20, wherein the mask layer contacts the polymeric layer.

UNITED STATES PATENT AND TRADEMARK OFFICE
CERTIFICATE OF CORRECTION

PATENT NO. : 6,552,432 B2
APPLICATION NO. : 09/944984
DATED : April 22, 2003
INVENTOR(S) : Paul A. Farrar It is certified that error appears in the above-identified patent and that said Letters Patent is hereby corrected as shown below:

24. An integrated-circuit assembly comprising:
one or more transistor contact regions;
an oxidation-resistant polymeric layer having one or more openings, with each opening exposing at least a portion of one of the transistor contact regions and having a respective width;
a lift-off structure layer overlying the oxidation-resistant polymeric layer having a first opening overlying at least one of the openings in the polymeric layer, with the first opening having a width less than the width of the one opening in the polymeric layer;
a diffusion-barrier layer having at least a first diffusion-barrier portion on the lift-off layer and at least a second diffusion-barrier portion within the opening in the polymeric layer on at least one or more of the transistor contact regions; and
a copper-, gold-, or silver-based layer having at least a portion on the first diffusion- barrier portion and at least a portion on the second diffusion-barrier portion.

25. The integrated-circuit assembly of claim 24, wherein the first opening has a width less than about 0.25 microns.

26. The integrated-circuit assembly of claim 24, wherein the diffusion-barrier layer consists of zirconium, hafnium, titanium, tantalum, or tantalum nitride.

27. The integrated-circuit assembly of claim 24, wherein the mask layer contacts the polymeric layer.

28. An integrated-circuit assembly comprising:
one or more transistor contact regions;
an oxidation-resistant polymeric layer having one or more openings, with each opening exposing at least a portion of one of the transistor contact regions and having a respective width; and
a mask layer overlying the oxidation-resistant polymeric layer having a mask opening overlying at least one of the openings in the polymeric layer, with the mask opening having a width less than the width of the one opening in the polymeric layer, wherein the mask opening has one or more negative sloping sidewalls.

29. The integrated-circuit assembly of claim 28, wherein each of the one or more transistor contact regions comprises a contact.

30. The integrated-circuit assembly of claim 28, wherein the width of the one opening in the polymeric layer is at least five percent greater than the width of the mask opening.

UNITED STATES PATENT AND TRADEMARK OFFICE
CERTIFICATE OF CORRECTION

| | |
|---|---|
| PATENT NO. | : 6,552,432 B2 |
| APPLICATION NO. | : 09/944984 |
| DATED | : April 22, 2003 |
| INVENTOR(S) | : Paul A. Farrar |

It is certified that error appears in the above-identified patent and that said Letters Patent is hereby corrected as shown below:

31. The integrated-circuit assembly of claim 28, wherein the mask layer contacts the polymeric layer.

32. The integrated-circuit assembly of claim 28, wherein the mask layer consists of photoresist.

33. The integrated-circuit assembly of claim 28, wherein the mask layer comprises a resist material and a non-resist material.

34. The integrated-circuit assembly of claim 28, wherein the mask layer comprises a lift-off structure.

35. An integrated-circuit assembly comprising:
one or more transistor contact regions;
an oxidation-resistant polymeric layer having one or more openings, with each opening exposing at least a portion of one of the transistor contact regions and having a respective width;
a lift-off structure layer overlying the oxidation-resistant polymeric layer having a first opening overlying at least one of the openings in the polymeric layer, with the first opening having a width less than the width of the one opening in the polymeric layer and having one or more negative sloping sidewalls;
a diffusion-barrier layer having at least a first diffusion-barrier portion on the lift-off layer and at least a second diffusion-barrier portion within the opening in the polymeric layer on at least one or more of the transistor contact regions; and
a copper-, gold-, or silver-based layer having at least a portion on the first diffusion- barrier portion and at least a portion on the second diffusion-barrier portion.

36. The integrated-circuit assembly of claim 35, wherein the first opening has a width less than about 0.25 microns.

37. The integrated-circuit assembly of claim 35, wherein the diffusion-barrier layer consists of zirconium, hafnium, titanium, tantalum, or tantalum nitride.

UNITED STATES PATENT AND TRADEMARK OFFICE
CERTIFICATE OF CORRECTION

PATENT NO. : 6,552,432 B2
APPLICATION NO. : 09/944984
DATED : April 22, 2003
INVENTOR(S) : Paul A. Farrar It is certified that error appears in the above-identified patent and that said Letters Patent is hereby corrected as shown below:

38. The integrated-circuit assembly of claim 35, wherein the mask layer contacts the polymeric layer. --

Signed and Sealed this

Twenty-eighth Day of November, 2006

JON W. DUDAS
*Director of the United States Patent and Trademark Office*